(12) United States Patent
Enomoto et al.

(10) Patent No.: US 12,367,602 B2
(45) Date of Patent: Jul. 22, 2025

(54) INFORMATION PROCESSING APPARATUS FOR TEACHING TRANSFER POSITION OF SUBSTRATE, TRANSFER POSITION TEACHING METHOD, AND SUBSTRATE PROCESSING APPARATUS INCLUDING THE INFORMATION PROCESSING APPARATUS

(71) Applicant: Tokyo Electron Limited, Tokyo (JP)

(72) Inventors: Tadashi Enomoto, Iwate (JP); Nao Akashi, Hokkaido (JP); Yutai Matsuhashi, Iwate (JP)

(73) Assignee: TOKYO ELECTRON LIMITED, Tokyo (JP)

(*) Notice: Subject to any disclaimer, the term of this patent is extended or adjusted under 35 U.S.C. 154(b) by 316 days.

(21) Appl. No.: 17/824,730

(22) Filed: May 25, 2022

(65) Prior Publication Data

US 2022/0383536 A1 Dec. 1, 2022

(30) Foreign Application Priority Data

May 31, 2021 (JP) .................. 2021-091866

(51) Int. Cl.
| | | |
|---|---|---|
| G06T 7/70 | (2017.01) | |
| G06T 7/00 | (2017.01) | |
| H01L 21/677 | (2006.01) | |
| H01L 21/68 | (2006.01) | |

(52) U.S. Cl.
CPC .............. *G06T 7/70* (2017.01); *G06T 7/0004* (2013.01); *H01L 21/67763* (2013.01); *H01L 21/681* (2013.01); *G06T 2207/30148* (2013.01)

(58) Field of Classification Search
CPC ............ G06T 7/70; G06T 7/0004; G06T 2207/30148; H01L 21/67763; H01L 21/681; H01L 21/67265; H01L 21/67778; H01L 21/67781; H01L 21/67766; H01L 21/68707

See application file for complete search history.

(56) References Cited

U.S. PATENT DOCUMENTS

2010/0220183 A1* 9/2010 Yoro .................. H01L 21/681
348/86

FOREIGN PATENT DOCUMENTS

| JP | 2008-080466 A | 4/2008 |
| JP | 2018-182217 A | 11/2018 |
| JP | 2019-046843 A | 3/2019 |

* cited by examiner

*Primary Examiner* — Hwa Andrew Lee
(74) *Attorney, Agent, or Firm* — Venjuris P.C.

(57) ABSTRACT

An information processing apparatus of a substrate processing apparatus including a transport device includes an image data acquisition unit that acquires image data of a disposing position of a processing target substrate, a first image processing unit that digitizes a positional relationship among the transport source object, the transport device, and the substrate, a second image processing unit that digitizes a positional relationship among the transport destination object, the transport device, and the substrate, a first transfer teaching unit that outputs first correction data of the moving operation of the transport device of receiving the substrate from the transport source object, and a second transfer teaching unit that outputs second correction data of the moving operation of the transport device of disposing the substrate in the transport destination object.

10 Claims, 15 Drawing Sheets

INFORMATION PROCESSING APPARATUS FOR TEACHING TRANSFER POSITION OF SUBSTRATE, TRANSFER POSITION TEACHING METHOD, AND SUBSTRATE PROCESSING APPARATUS INCLUDING THE INFORMATION PROCESSING APPARATUS

CROSS-REFERENCE TO RELATED APPLICATIONS

This application is based on and claims priority from Japanese Patent Application No. 2021-091866, filed on May 31, 2021 with the Japan Patent Office, the disclosure of which is incorporated herein in its entirety by reference.

TECHNICAL FIELD

The present disclosure relates to an information processing apparatus, a transfer position teaching method, and a substrate processing apparatus.

BACKGROUND

A vertical heat treatment apparatus including a vertically extended heat treatment furnace has been known. The vertical heat treatment apparatus performs a heat treatment to the wafers while the heat treatment furnace accommodates a plurality of wafers in a state of being disposed in a wafer boat. In the vertical heat treatment apparatus, the plurality of wafers stored in a carrier are simultaneously transported to the wafer boat by a wafer transport device having a plurality of forks (see, e.g., Japanese Patent Laid-Open Publication No. 2019-046843).

SUMMARY

An aspect of the present disclosure is an information processing apparatus of a substrate processing apparatus including a transfer device includes an image data acquisition unit that acquires, from a photographing device provided to photograph a disposing position of a processing target substrate in a transport source object and a transport destination object, image data of the disposing position of the processing target substrate in the transport source object and the transport destination object, a first image processing unit that digitizes a positional relationship among the transport source object, the transport device, and the processing target substrate based on the image data obtained by photographing a moving operation of the transport device of receiving the processing target substrate from the disposing position of the processing target substrate in the transport source object, a second image processing unit that digitizes a positional relationship among the transport destination object, the transport device, and the processing target substrate based on the image data obtained by photographing a moving operation of the transport device of disposing the processing target substrate at the disposing position of the processing target substrate in the transport destination object, a first transfer teaching unit that outputs first correction data of the moving operation of the transport device of receiving the processing target substrate from the transport source object based on the digitized positional relationship among the disposing position of the processing target substrate in the transport source object, the transport device, and the processing target substrate, and a second transfer teaching unit that outputs second correction data of the moving operation of the transport device of disposing the processing target substrate in the transport destination object based on the digitized positional relationship among the disposing position of the processing target substrate in the transport destination object, the transport device, and the processing target substrate. The information processing apparatus teaches a transfer position of the processing target substrate with respect to the transfer device based on the first and second correction data while the transfer device transfers the processing target substrate between the transport source object and the transport destination object.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
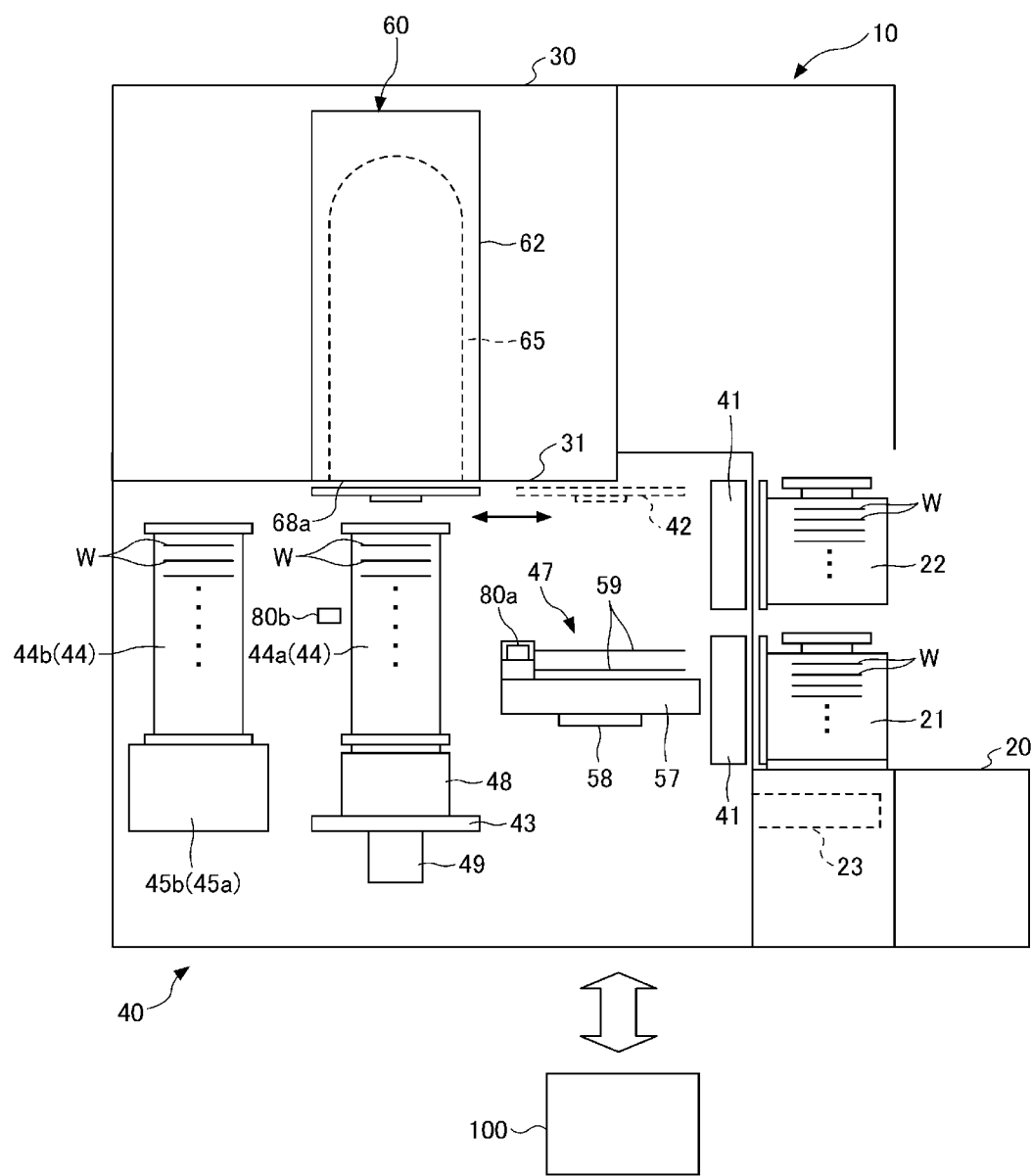
FIG. 1 is a vertical cross-sectional view schematically illustrating an example of a substrate processing system according to the present embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure, which are illustrative but not limited, will be described with reference to the accompanying drawings. In the accompanying drawings, the same or corresponding members or parts are designated by the same or corresponding reference numerals, and duplicate descriptions thereof will be omitted as appropriate. Further, in the present embodiments, a heat treatment apparatus which is an example of a substrate processing apparatus will be described as an example, but the present disclosure is not limited to the heat treatment apparatus.

First Embodiment

Figure 2:
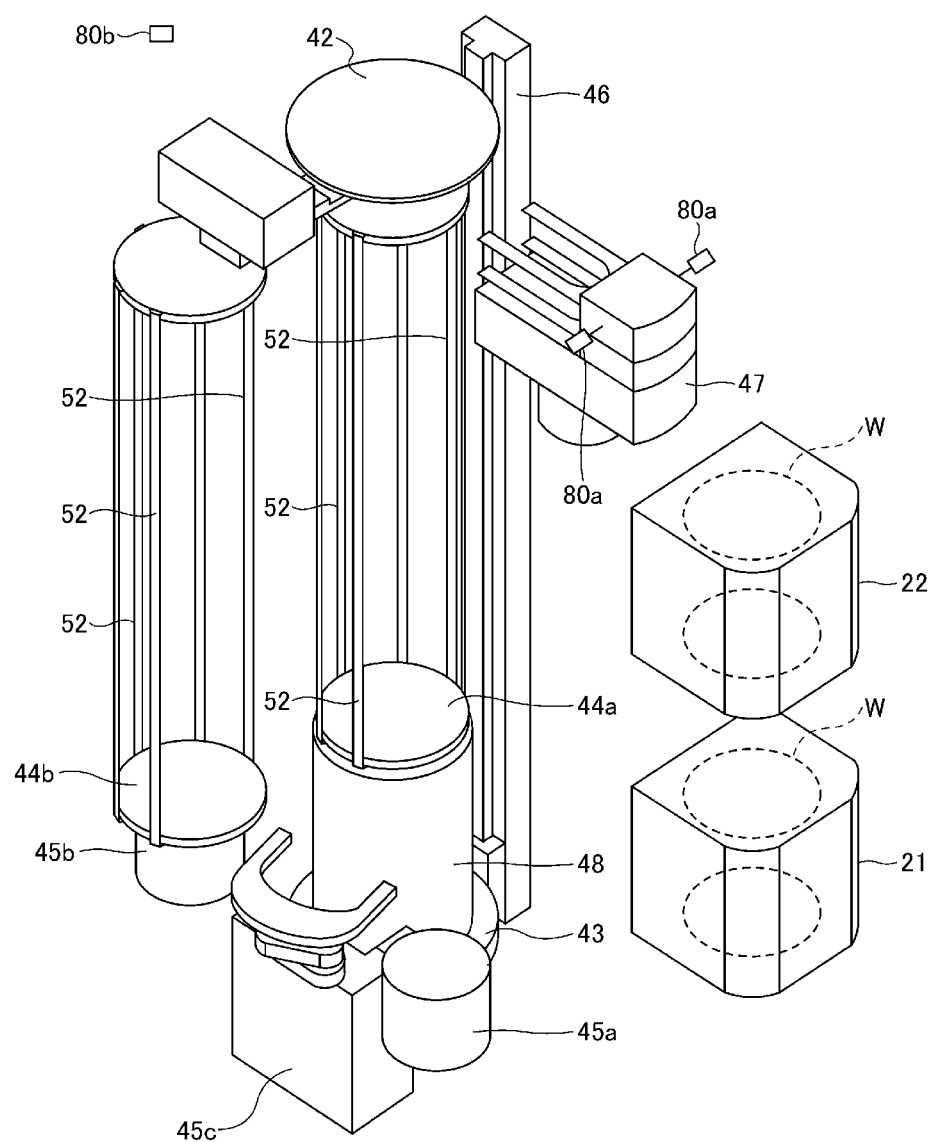
FIG. 2 is a perspective view schematically illustrating an example of a loading area.

FIG. 1 is a vertical cross-sectional view schematically illustrating an example of a substrate processing system according to the present embodiment. FIG. 2 is a perspective view schematically illustrating an example of a loading area. As illustrated in FIG. 1, the substrate processing system includes a heat treatment apparatus 10 and a control device 100. The control device 100 may be provided inside a housing of the heat treatment apparatus 10 as a part of the configuration of the heat treatment apparatus 10 or may be provided outside the housing of the heat treatment apparatus 10 separately from the configuration of the heat treatment apparatus 10. For example, the control device 100 may be realized using a server device connected to enable data communication via a network, or a cloud service available via a network.

The heat treatment apparatus 10 includes a vertical heat treatment furnace 60 to be described later, and may hold and store a plurality of wafers W in a boat at a predetermined interval along the vertical direction to perform various heat treatments such as oxidization, diffusion, depressurization, and CVD on the wafers W. Hereinafter, an example of an application to the heat treatment apparatus 10 for oxidizing the surface of the wafer W by supplying a processing gas to the wafer W provided in a processing container 65 to be described later will be described. The wafer W is an example of a processing target substrate. The processing target substrate is not limited to the circular wafer W.

The heat treatment apparatus 10 of FIG. 1 has a stage (load port) 20, a housing 30, and the control device 100. The stage (load port) 20 is provided on a front portion of the housing 30. The housing 30 includes a loading area (working area) 40 and the heat treatment furnace 60.

The loading area 40 is provided at the lower side inside the housing 30. The heat treatment furnace 60 is provided above the loading area 40 inside the housing 30. Further, a base plate 31 is provided between the loading area 40 and the heat treatment furnace 60.

The stage (load port) 20 is configured to perform the carry-in/out of the wafer W to and from the housing 30. Storage containers 21 and 22 are placed on the stage (load port) 20. The storage containers 21 and 22 are closed storage containers (FOUPs) capable of storing a plurality of (e.g., about 25) wafers W at a predetermined interval, each storage container having a removable lid on the front surface thereof. The storage containers 21 and 22 are an example of a transport source object or a transport destination object in which the wafers W are able to be disposed.

Further, an alignment device (aligner) 23 may be provided below the stage 20 for aligning, in one direction, cutouts (e.g., notches) provided on the outer periphery of the wafers W transferred by a transfer mechanism 47 to be described later.

The loading area (working area) 40 is configured to perform the transfer of the wafer W between the storage containers 21 and 22 and a boat 44 to be described later to carry (load) the boat 44 into the processing container 65 and carry out (unload) the boat 44 from the processing container 65. The loading area 40 is provided with a door mechanism 41, a shutter mechanism 42, a lid body 43, the boat 44, a base 45a, a base 45b, an elevating mechanism 46, and the transfer mechanism 47.

The door mechanism 41 is configured to remove the lids of the storage containers 21 and 22, and open the storage containers 21 and 22 and the loading area 40 in communication with each other. The shutter mechanism 42 is provided above the loading area 40. The shutter mechanism 42 is provided to cover (or block) a furnace opening 68a to be described later in order to suppress or prevent heat inside the high temperature furnace from being released from the furnace opening 68a to the loading area 40 when the lid body 43 is opened.

The lid body 43 includes a heat insulating cylinder 48 and a rotation mechanism 49. The heat insulating cylinder 48 is provided on the lid body 43. The heat insulating cylinder 48 is configured to prevent the boat 44 from being cooled by heat transfer with the lid body 43 side, and keeping the boat 44 warm. The rotation mechanism 49 is attached to the bottom of the lid body 43. The rotation mechanism 49 is configured to rotate the boat 44. A rotation shaft of the rotation mechanism 49 is provided to airtightly penetrate the lid body 43 and to rotate a rotary table (not illustrated) arranged on the lid body 43.

The elevating mechanism 46 elevates and drives the lid body 43 upon the carry-in/out of the boat 44 from the loading area 40 to the processing container 65. Then, the lid body 43 is provided to abut on the furnace opening 68a to be described later, and thus, seal the furnace opening 68a when the lid body 43 raised by the elevating mechanism 46 is being carried into the processing container 65. The boat 44 placed on the lid body 43 may rotatably hold the wafer W in a horizontal plane inside the processing container 65.

The heat treatment apparatus 10 may include a plurality of boats 44. In the present embodiment, an example in which it includes two boats 44 will be described with reference to FIG. 2.

Boats 44a and 44b are provided in the loading area 40. The loading area 40 is provided with the base 45a, the base 45b, and a boat transport mechanism 45c. The bases 45a and 45b are stages to which the boats 44a and 44b are transferred from the lid body 43, respectively. The boat transport mechanism 45c for transferring the boat 44a or 44b from the lid body 43 to the base 45a or 45b.

The boats 44a and 44b are made of, for example, quartz, and are adapted to mount the wafers W having a large diameter, for example, a diameter of 300 mm in a horizontal state at a predetermined interval (pitch width) in the vertical direction. The boats 44a and 44b are formed, for example, by interposing a plurality of (e.g., three) support columns 52 between a top plate and a bottom plate. Each of the support columns 52 is provided with support portions such as grooves or claws for supporting (holding) the wafers W. Further, the boats 44a and 44b may be appropriately provided with auxiliary columns together with the support columns 52. The boats 44a and 44b are an example of a transport source object or a transport destination object in which the wafers W are able to be put.

The transfer mechanism 47 is configured to perform the transfer of the wafer W between the storage container 21 or 22 and the boat 44a or 44b. The transfer mechanism 47 is an example of a transport device that transports the wafer W.

The transfer mechanism 47 includes a base 57, an elevating arm 58, and a plurality of forks 59. The base 57 is provided to be movable up and down and be able to turn. The elevating arm 58 is provided to be movable (up and down) in the vertical direction by a ball screw. The base 57 is provided on the elevating arm 58 to be able to turn horizontally. Further, the plurality of forks are an example of a transfer plate (transfer unit) that supports the wafer W.

Further, cameras 80a and 80b are provided in the loading area 40. The cameras 80a and 80b are an example of a photographing device. The camera 80a is provided to photograph the direction from the transfer mechanism 47 to the storage container 21 or 22 and the direction from the transfer mechanism 47 to the boat 44a or 44b. The cameras 80a of FIGS. 1 and 2 is an example in which it is provided on a movable part of the transfer mechanism 47.

For example, the camera 80a photographs a moving operation in which the transfer mechanism 47 receives the wafer W from the storage container 21 or 22 and a moving operation in which the transfer mechanism 47 disposes the wafer W in the boat 44a or 44b. Further, the camera 80a photographs an image of a moving operation in which the transfer mechanism 47 receives the wafer W from the boat 44a or 44b and a moving operation in which the transfer mechanism 47 disposes the wafer W in the storage container 21 or 22.

Further, the camera 80b of FIGS. 1 and 2 is provided to be able to photograph the back of the boat 44a or 44b when viewed from the transfer mechanism 47 side. The camera 80b of FIGS. 1 and 2 show an example in which it is provided on the sidewall of the housing 30.

For example, the camera 80b photographs the moving operation in which the transfer mechanism 47 disposes the wafer W in the boat 44a or 44b. Further, the camera 80b photographs the moving operation in which the transfer mechanism 47 receives the wafer W from the boat 44a or 44b.

The control device 100 is a device that controls the entire heat treatment apparatus 10. The control device 100 controls an operation of the heat treatment apparatus 10 so that a heat treatment is performed under various treatment conditions indicated in a recipe. Further, as will be described later, the control device 100 executes a fully automatic teaching processing of automating the teaching of a transfer position of the wafer W with respect to the transfer mechanism 47, an autonomous automatic transfer processing of autonomously controlling the transport of the wafer W by the transfer mechanism 47, and an abnormality sign detection processing of supporting preventive maintenance activities of the transfer mechanism 47.

Figure 3:
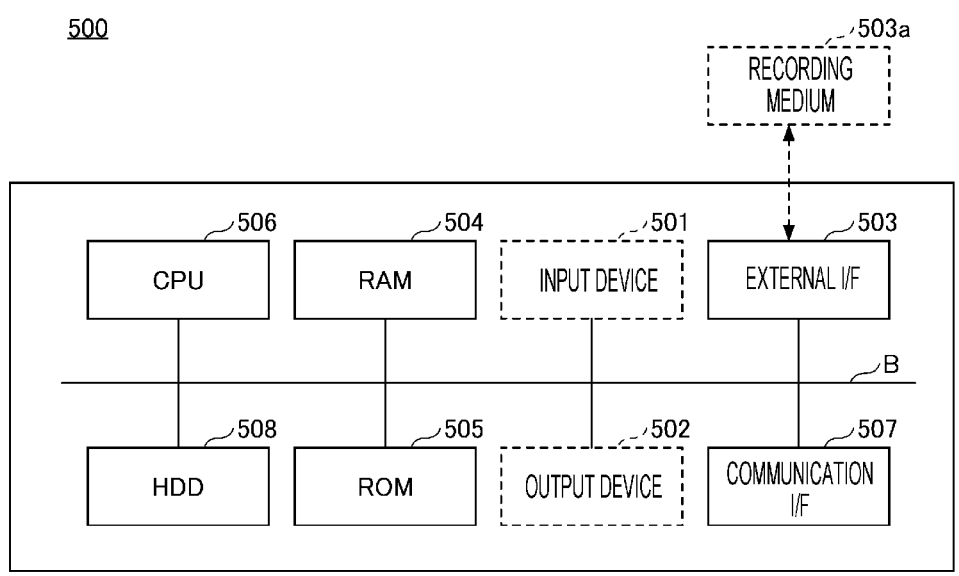
FIG. 3 is a diagram illustrating an example of a hardware configuration of a computer.

The control device 100 is realized by a computer having a hardware configuration, for example, as illustrated in FIG. 3. FIG. 3 is a diagram illustrating an example of a hardware configuration of a computer.

The computer 500 of FIG. 3 includes an input device 501, an output device 502, an external interface (I/F) 503, a random access memory (RAM) 504, a read only memory (ROM) 505, a central processing unit (CPU) 506, a communication I/F 507, and a hard disk drive (HDD) 508, each of which is connected to each other by a bus B. The input device 501 and the output device 502 may be connected and used when necessary.

The input device 501 is a keyboard, a mouse, or a touch panel, and is used by an operator to input each operation signal. The output device 502 is a display, and displays the processing results by the computer 500. The communication I/F 507 is an interface that connects the computer 500 to a network. The HDD 508 is an example of a non-volatile storage device that stores programs and data.

The external I/F 503 is an interface for use with an external device. The computer 500 may perform read and/or write on a recording medium 503a such as a secure digital (SD) memory card via the external I/F 503. The ROM 505 is an example of a non-volatile semiconductor memory (storage device) in which programs and data are stored. The RAM 504 is an example of a volatile semiconductor memory (storage device) that temporarily holds programs and data.

The CPU 506 is an arithmetic unit that realizes control and functions of the entire computer 500 by reading programs and data from a storage device such as the ROM 505 or the HDD 508 onto the RAM 504 and executing a processing.

The control device 100 may realize various functions to be described later by causing the computer 500 having the hardware configuration illustrated in FIG. 3 to execute a processing according to the programs.

<Functional Configuration>

Figure 4:
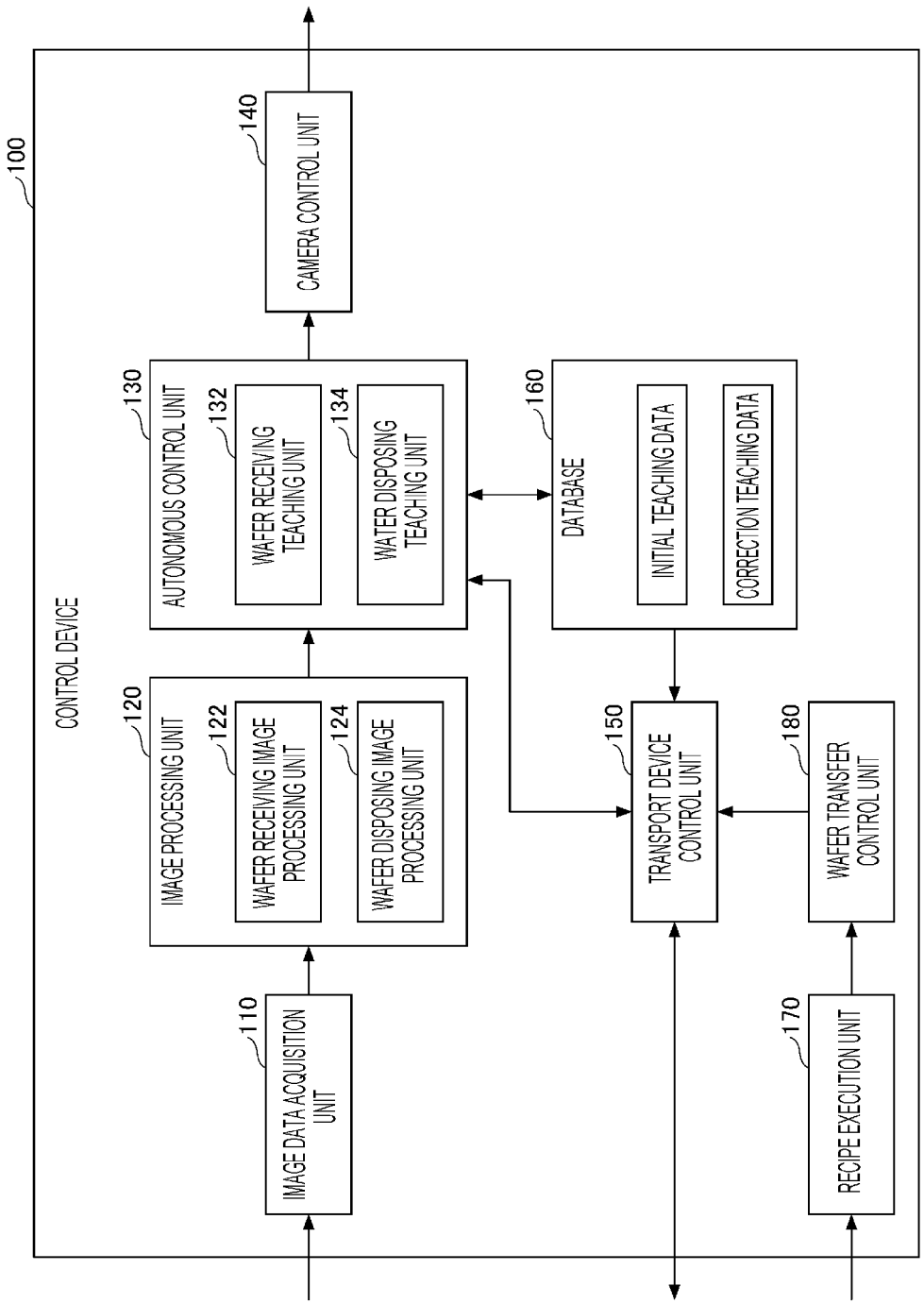
FIG. 4 is a diagram illustrating an example of a functional configuration of a control device.

An example of a functional configuration of the control device 100 will be described with reference to FIG. 4. FIG. 4 is a diagram illustrating an example of a functional configuration of the control device. The control device 100 includes an image data acquisition unit 110, an image processing unit 120, an autonomous control unit 130, a camera control unit 140, a transport device control unit 150, a database 160, a recipe execution unit 170, and a wafer transfer control unit 180.

The image processing unit 120 includes a wafer receiving image processing unit 122 and a wafer disposing image processing unit 124. The autonomous control unit 130 includes a wafer receiving teaching unit 132 and a wafer disposing teaching unit 134. The functional configuration of FIG. 4 omits any functional configuration unnecessary for the description of the present embodiment as appropriate.

The image data acquisition unit 110 acquires image data photographed by the cameras 80a and 80b (hereinafter, the cameras 80a and 80b being appropriately collectively referred to as the camera 80). For example, the image data acquisition unit 110 acquires image data of the moving operation in which the transfer mechanism 47 receives the wafer W from the storage container 21 or 22 and the moving operation in which the transfer mechanism 47 disposes the wafer W in the boat 44a or 44b. Further, for example, the image data acquisition unit 110 acquires image data of the moving operation in which the transfer mechanism 47 receives the wafer W from the boat 44a or 44b and the moving operation in which the transfer mechanism 47 disposes the wafer W in the storage container 21 or 22.

The image processing unit 120 performs an image processing on the image data acquired by the image data acquisition unit 110, and thus, analyzes (measures) a required distance (dimension) from the position of the support portion such as the groove or the claw of the storage container 21 or 22, the position of the fork 59 of the transfer mechanism 47, and the position of the wafer W to digitize a positional relationship. In the following, an example in which the support portion of the storage container 21 or 22 is the groove will be described.

Further, the image processing unit 120 performs an image processing on the image data acquired by the image data acquisition unit 110, and thus, analyzes (measures) a required distance (dimension) from the position of the support portion such as the groove or the claw of the boat 44a or 44b, the position of the fork 59 of the transfer mechanism 47, and the position of the wafer W to digitize a positional relationship. In the following, an example in which the support portion of the boat 44a or 44b is the groove will be described.

The wafer receiving image processing unit 122 of the image processing unit 120 performs an image processing on the image data of the moving operation of receiving the wafer W from the storage container 21 or 22, and thus, analyzes the required distance from the position of the groove of the storage container 21 or 22, the position of the fork 59 of the transfer mechanism 47, and the position of the wafer W to digitize a positional relationship.

Further, the wafer receiving image processing unit 122 of the image processing unit 120 performs an image processing on the image data of the moving operation of receiving the wafer W from the boat 44a or 44b, and thus, analyzes the required distance from the position of the groove of the boat 44a or 44b, the position of the fork 59 of the transfer mechanism 47, and the position of the wafer W to digitize a positional relationship.

The wafer disposing image processing unit 124 of the image processing unit 120 performs an image processing on the image data of the moving operation of disposing the wafer W in the boat 44a or 44b, and thus, analyzes the required distance from the position of the groove of the boar 44a or 44b, the position of the fork 59 of the transfer mechanism 47, and the position of the wafer W to digitize a positional relationship.

Further, the wafer disposing image processing unit 124 of the image processing unit 120 performs an image processing on the image data of the moving operation of disposing the wafer W in the storage container 21 or 22, and thus, analyzes the required distance from the position of the groove of the storage container 21 or 22, the position of the fork 59 of the transfer mechanism 47, and the position of the wafer W to digitize a positional relationship.

The autonomous control unit 130 calculates correction data of the disposing position of the wafer W in the storage container 21 or 22 based on the digitized positional relationship among the position of the groove of the storage container 21 or 22, the position of the fork 59 of the transfer mechanism 47, and the position of the wafer W, and performs teaching of the transfer position of the wafer W with respect to the transfer mechanism 47. For example, the correction data of the disposing position of the wafer W in the storage container 21 or 22 is used to correct a moving operation in which the fork 59 of the transfer mechanism 47 receives the wafer W from the storage container 21 or 22, or a moving operation in which the fork 59 of the transfer mechanism 47 disposes the wafer W in the storage container 21 or 22.

Further, the autonomous control unit 130 calculates correction data of the disposing position of the wafer W in the boat 44a or 44b based on the digitized positional relationship among the position of the groove of the boat 44a or 44b, the position of the fork 59 of the transfer mechanism 47, and the position of the wafer W, and performs teaching of the transfer position of the wafer W with respect to the transfer mechanism 47. For example, the correction data of the disposing position of the wafer W in the boat 44a or 44b is used to correct a moving operation in which the fork 59 of the transfer mechanism 47 receives the wafer W from the boat 44a or 44b, or a moving operation in which the fork 59 of the transfer mechanism 47 disposes the wafer W in the boat 44a or 44b.

The wafer receiving teaching unit 132 of the autonomous control unit 130 calculates the correction data of the disposing position of the wafer W in the storage container 21 or 22 based on the positional relationship among the position of the groove of the storage container 21 or 22, the position of the fork 59 of the transfer mechanism 47, and the position of the wafer W, which is digitized by image-processing the image data of the moving operation of receiving the wafer W from the storage container 21 or 22.

Further, the wafer receiving teaching unit 132 of the autonomous control unit 130 calculates the correction data of the disposing position of the wafer W in the boat 44a or 44b based on the positional relationship among the position of the groove of the boat 44a or 44b, the position of the fork 59 of the transfer mechanism 47, and the position of the wafer W, which is digitized by image-processing the image data of the moving operation of receiving the wafer W from the boat 44a or 44b.

The wafer disposing teaching unit 134 of the autonomous control unit 130 calculates the correction data of the disposing position of the wafer W in the boat 44a or 44b based on the positional relationship among the position of the groove of the boat 44a or 44b, the position of the fork 59 of the transfer mechanism 47, and the position of the wafer W, which is digitized by image-processing the image data of the moving operation of disposing the wafer W in the boat 44a or 44b.

Further, the wafer disposing teaching unit 134 of the autonomous control unit 130 calculates the correction data of the disposing position of the wafer W in the storage container 21 or 22 based on the positional relationship among the position of the groove of the storage container 21 or 22, the position of the fork 59 of the transfer mechanism 47, and the position of the wafer W, which is digitized by image-processing the image data of the moving operation of disposing the wafer W in the storage container 21 or 22.

The camera control unit 140 controls the photographing timing of the camera 80 according to an instruction from the autonomous control unit 130. The database 160 stores initial teaching data and correction teaching data for teaching the disposing position of the wafer W with respect to the transfer mechanism 47 of the heat treatment apparatus 10. For example, the initial teaching data is teaching data preset in the heat treatment apparatus 10, and is set for each model of the heat treatment apparatus 10. The correction teaching data is teaching data in which the positional shift of the disposing position of the wafer W caused by mechanical differences of the heat treatment apparatus 10 or erratic adjustment by the operator is corrected.

The transport device control unit 150 controls the moving operation of the transfer mechanism 47 according to the control from the autonomous control unit 130 or the wafer transfer control unit 180. The transport device control unit 150 controls the moving operation of the transfer mechanism 47 using the initial teaching data and the correction teaching data stored in the database 160.

The recipe execution unit 170 controls the operation of the heat treatment apparatus 10 so that a heat treatment is performed under the processing conditions indicated in a recipe. The wafer transfer control unit 180 issues an instruction to the transport device control unit 150 so that the wafer W is transported between the storage container 21 or 22 and the boat 44a or 44b according to the control from the recipe execution unit 170.

<Processing>

Figure 5:
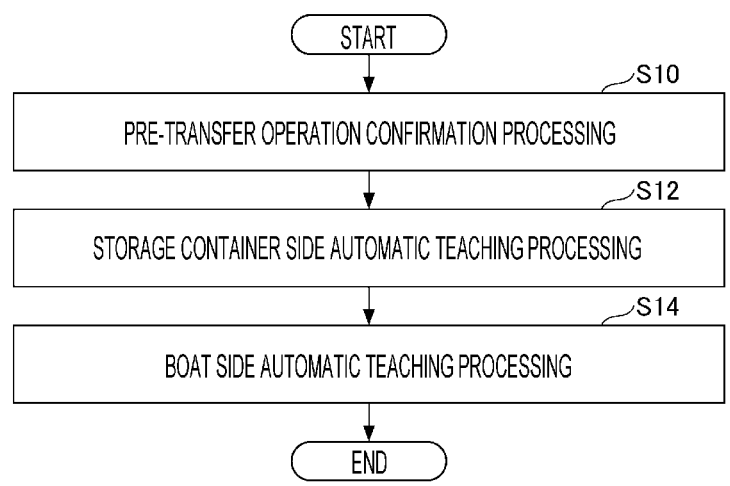
FIG. 5 is a flowchart illustrating an example of a fully automatic teaching processing of a transfer mechanism according to the present embodiment.

Hereinafter, an example of a fully automatic teaching processing of automating the teaching of the transfer mechanism 47 that transports the wafer W between the storage container 21 or 22 and the boat 44a or 44b will be described. The control device 100 performs a fully automatic teaching processing of the transfer mechanism 47, for example, according to the procedure of FIG. 5. FIG. 5 is a flowchart illustrating an example of a fully automatic teaching processing of the transfer mechanism according to the present embodiment.

In step S10, the control device 100 performs a pre-transfer operation confirmation processing. The pre-transfer operation confirmation processing in step S10 is a confirmation processing before a transfer operation, which is a processing of performing the moving operation of the fork 59 of the transfer mechanism 47 based on the initial teaching data without performing the transport of the wafer W, and confirming the transfer positions of the storage container 21 or 22 and the boat 44a or 44b.

In step S12, the control device 100 performs a storage container side automatic teaching processing. The storage container side automatic teaching processing in step S12 performs the moving operation of the fork 59 of the transfer mechanism 47, based on the correction teaching data obtained by correcting the initial teaching data, by the pre-transfer operation confirmation processing in step S10. Thus, the fork 59 of the transfer mechanism 47 receives the wafer W from the storage container 21 or 22.

The control device 100 acquires image data obtained by photographing the moving operation in which the fork 59 of the transfer mechanism 47 receives the wafer W from the storage container 21 or 22 and digitizes the positional relationship among the groove of the storage container 21 or 22, the fork 59, and the wafer W by an image processing. The control device 100 outputs the correction teaching data for correcting the disposing position of the wafer W in the storage container 21 or 22 (for correcting the moving operation of the fork 59) based on the digitized positional relationship among the groove of the storage container 21 or 22, the fork 59, and the wafer W.

In step S14, the control device 100 performs a boat side automatic teaching processing. The boat side automatic teaching processing in step S14 performs the moving operation of the fork 59 of the transfer mechanism 47 based on the correction teaching data. Thus, the fork 59 of the transfer mechanism 47 disposes the wafer W in the boat 44a or 44b.

The control device 100 acquires image data obtained by photographing the moving operation in which the fork 59 of the transfer mechanism 47 disposes the wafer W in the boat 44a or 44b and digitizes the positional relationship among the groove of the boat 44a or 44b, the fork 59, and the wafer W by an image processing. Then, the control device 100 outputs the correction teaching data for correcting the disposing position of the wafer W in the boat 44a or 44b (for correcting the moving operation of the fork 59) based on the digitized positional relationship among the groove of the boat 44a or 44b, the fork 59, and the wafer W.

Hereinafter, the details of the pre-transfer operation confirmation processing illustrated in step S10, the storage container side automatic teaching processing illustrated in step S12, and the boat side automatic teaching processing illustrated in step S14 will be described. In the present embodiment, a position change in the moving operation of the fork 59 when receiving the wafer W from the disposing position or disposing the wafer W at the disposing position and a position where the camera 80 performs photographing are defined, for example, as illustrated in FIGS. 6A and 6B.

Figure 6A:
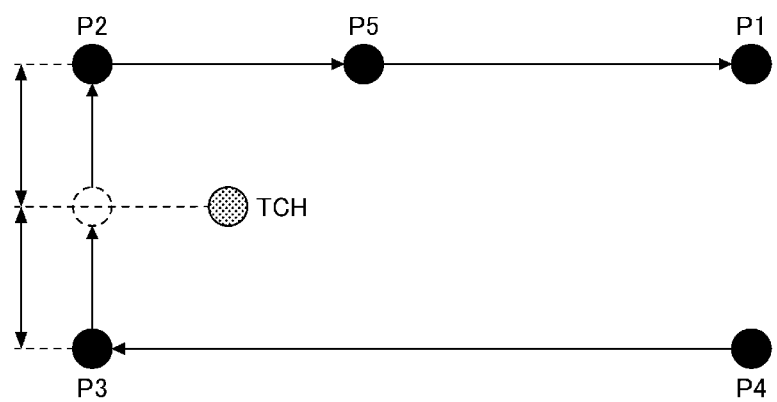
FIGS. 6A and 6B are explanatory diagrams illustrating an example of a position change in the moving operation of a fork when receiving or disposing a wafer W.
Figure 6B:
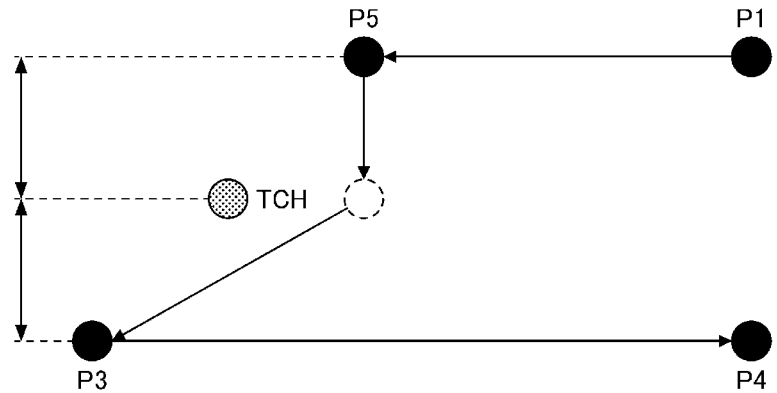

FIGS. 6A and 6B are explanatory diagrams illustrating an example of a position change in the moving operation of the fork when receiving or disposing the wafer W. FIG. 6A illustrates an example of a position change in the moving operation of the fork 59 when receiving the wafer W. FIG. 6B illustrates an example of a position change in the moving operation of the fork 59 when disposing the wafer W.

For example, FIG. 6A illustrates an example of a moving operation of moving the fork 59 in order through the positions P4→P3→P2→P5→P1. The position P3 in FIG. 6A is an example of a first position, and is, for example, a position immediately before the fork 59 receives the wafer W from the storage container 21 or 22. The position TCH is an example of a second position, and is, for example, a position where the fork 59 receives the wafer W from the storage container 21 or 22. The position P2 is an example of a third position and is, for example, a position after the fork 59 has received the wafer W from the storage container 21 or 22.

For example, FIG. 6B illustrates an example of a moving operation of moving the fork 59 in order through the positions P1→P5→P3→P4. The position P5 in FIG. 6B is an example of a fourth position, and is, for example, a position immediately before the fork 59 disposes the wafer W in the boat 44a or 44b. The position TCH is an example of a fifth position and is, for example, a position where the fork 59 disposes the wafer W in the boat 44a or 44b. The position P3 is an example of a sixth position and is, for example, a position after the fork 59 has disposed the wafer W in the boat 44a or 44b.

In the following description, a fully automatic teaching processing of automating the teaching of the transfer mechanism 47 that transports the wafer W between the storage container 21 and the boat 44a will be described.

Figure 7:
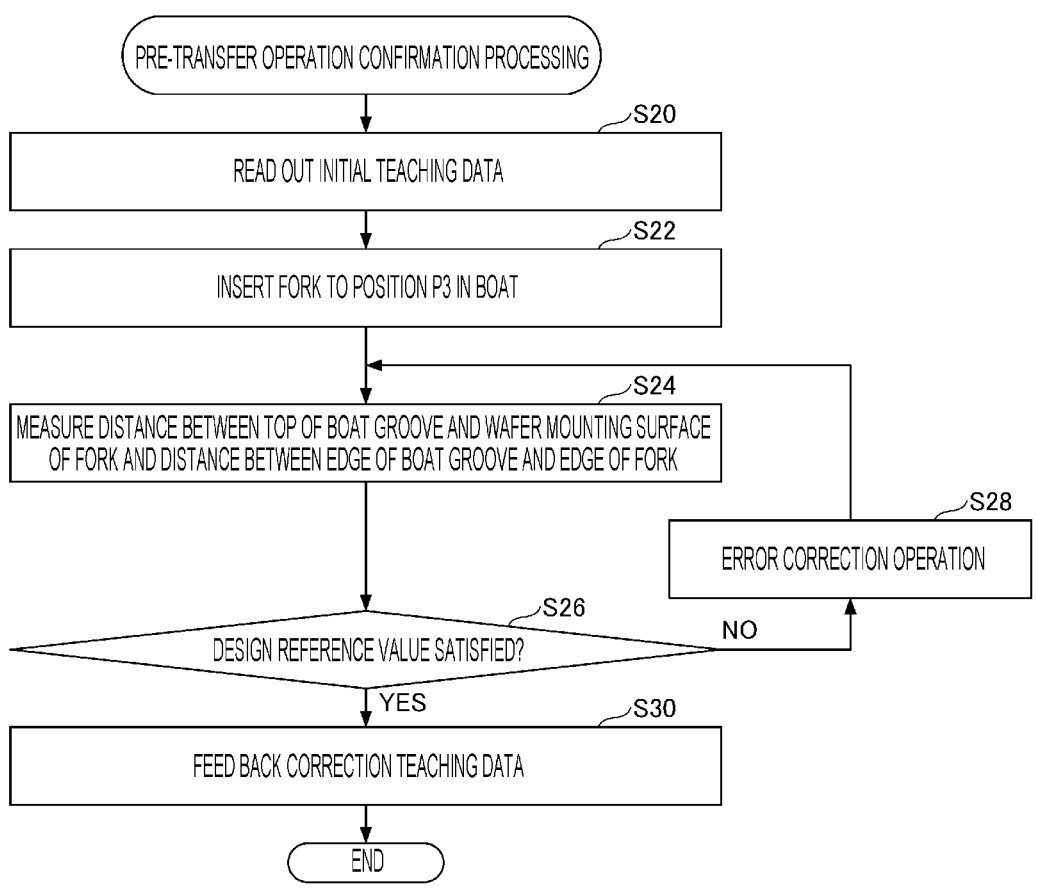
FIG. 7 is a flowchart illustrating an example of a boat side pre-transfer operation confirmation processing according to the present embodiment.

FIG. 7 is a flowchart illustrating an example of a boat side pre-transfer operation confirmation processing according to the present embodiment. In step S20, the autonomous control unit 130 of the control device 100 reads out the initial teaching data from the database 160. In step S22, the autonomous control unit 130 controls the transport device control unit 150 to insert the fork 59 to the position P3 in the boat 44a based on the initial teaching data. The transport device control unit 150 controls a moving operation of the transfer mechanism 47 to insert the fork 59 to the position P3 in the boat 44a according to the initial teaching data.

In step S24, the autonomous control unit 130 controls the camera 80 to perform photographing at the positions P3 and P5 in the boat 44a. The image data photographed by the camera 80 is illustrated in, for example, FIGS. 8A and 8B.

Figure 8A:
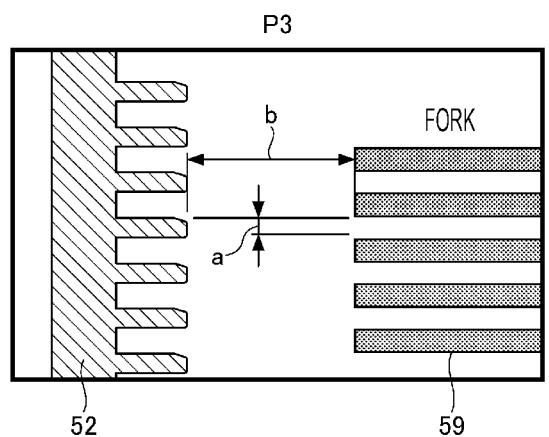
FIGS. 8A and 8B are image diagrams of an example of image data photographed by a camera.
Figure 8B:
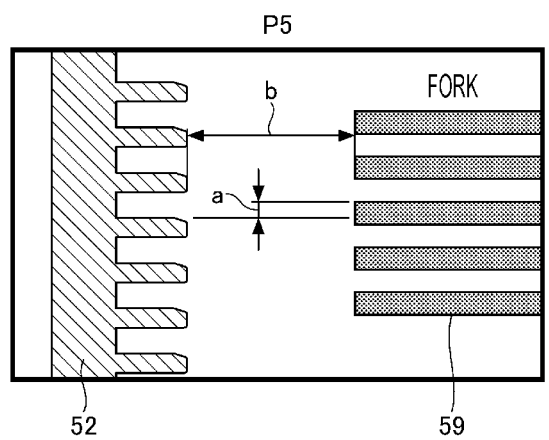

FIGS. 8A and 8B are image diagrams of an example of image data photographed by the camera. FIG. 8A is an image diagram of an example of image data photographed at the position P3. FIG. 8B is an image diagram of an example of image data photographed at the position P5.

The image data acquisition unit 110 acquires image data photographed by the camera 80 at the positions P3 and P5 in the boat 44a. The image processing unit 120 measures the distance a between the top of the groove (hereinafter referred to as a boat groove) of the support column 52 of the boat 44a and the wafer mounting surface of the fork 59 by image-processing the image data photographed at the positions P3 and P5 in the boat 44a. The image processing unit 120 measures the distance b between the edge of the boat groove and the edge of the fork 59.

In step S26, the autonomous control unit 130 determines whether or not the measured distance a between the top of the boat groove and the wafer mounting surface of the fork 59 at the positions P3 and P5 in the boat 44a and the measured distance b between the edge of the boat groove and the edge of the fork 59 satisfy a design reference value. When the design reference value is not satisfied, the autonomous control unit 130 performs an error correction operation in step S28, and repeatedly performs position correction of the moving operation of the fork 59 until the design reference value is satisfied.

In step S30, the autonomous control unit 130 feeds back the correction teaching data by storing the correction teaching data in the database 160 according to the result of the position correction of the moving operation of the fork 59 satisfying the design reference value.

Figure 9:
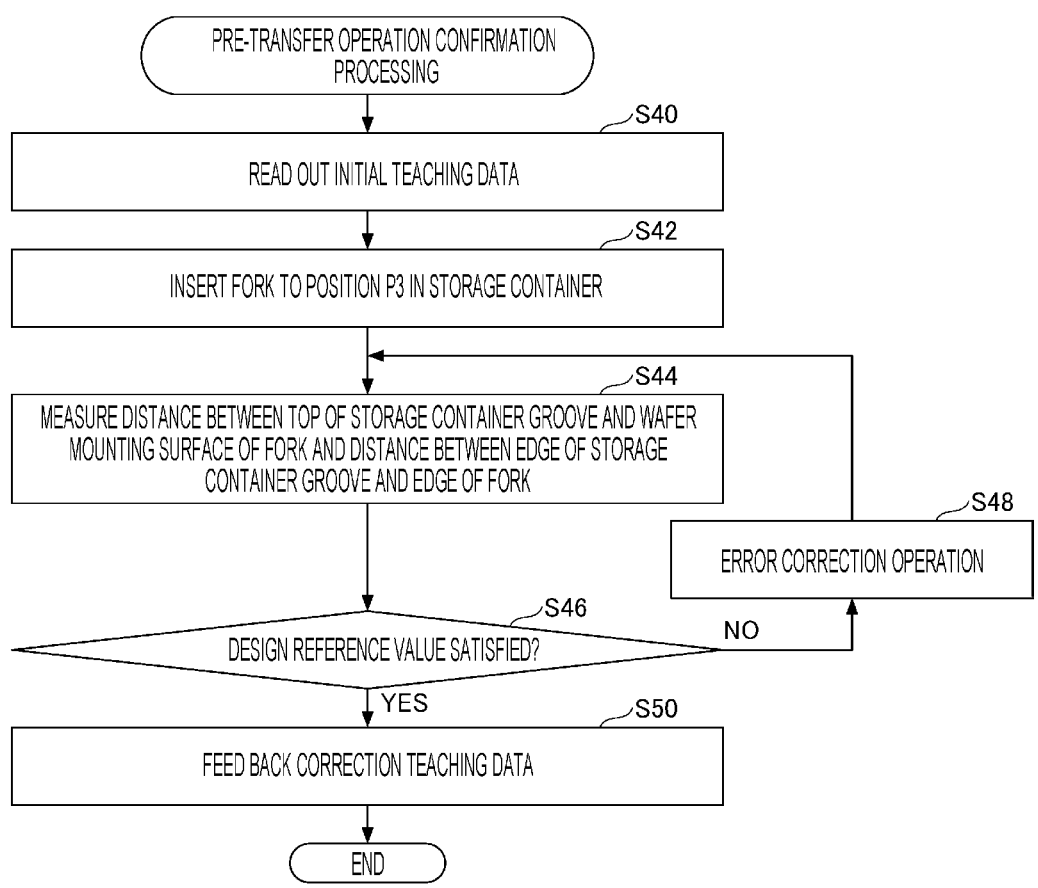
FIG. 9 is a flowchart illustrating an example of a storage container side pre-transfer operation confirmation processing according to the present embodiment.

After the boat side pre-transfer operation confirmation processing of FIG. 7, the control device 100 performs a storage container side pre-transfer operation confirmation processing as illustrated in FIG. 9. FIG. 9 is a flowchart illustrating an example of a storage container side pre-transfer operation confirmation processing according to the present embodiment. In step S40, the autonomous control unit 130 of the control device 100 reads out the initial teaching data from the database 160.

In step S42, the autonomous control unit 130 controls the transport device control unit 150 to insert the fork 59 to the position P3 in the storage container 21 based on the initial teaching data. The transport device control unit 150 controls a moving operation of the transfer mechanism 47 to insert the fork 59 to the position P3 in the storage container 21 according to the initial teaching data.

In step S44, the autonomous control unit 130 controls the camera 80 to perform photographing at the positions P3 and P5 in the storage container 21.

The image data acquisition unit 110 acquires image data photographed by the camera 80 at the positions P3 and P5 in the storage container 21. The image processing unit 120 measures the distance between the top of the groove of the storage container 21 (hereinafter referred to as a storage container groove) and the wafer mounting surface of the fork 59 by image-processing the image data photographed at the positions P3 and P5 in the storage container 21. The image processing unit 120 measures the distance between the edge of the storage container groove and the edge of the fork 59.

In step S46, the autonomous control unit 130 determines whether or not the measured distance between the top of the storage container groove and the wafer mounting surface of the fork 59 at the positions P3 and P5 in the storage container 21 and the measured distance between the edge of the storage container groove and the edge of the fork 59 satisfy a design reference value. When the design reference value is not satisfied, the autonomous control unit 130 performs an error correction operation in step S48, and repeatedly performs position correction of the moving operation of the fork 59 until the design reference value is satisfied.

In step S50, the autonomous control unit 130 feeds back the correction teaching data by storing the correction teaching data in the database 160 according to the result of the position correction of the moving operation of the fork 59 satisfying the design reference value.

Since the dimension of the storage container groove is sufficiently larger than that of the boat groove, the storage container side pre-transfer operation confirmation processing illustrated in FIG. 9 may be omitted.

Figure 10:
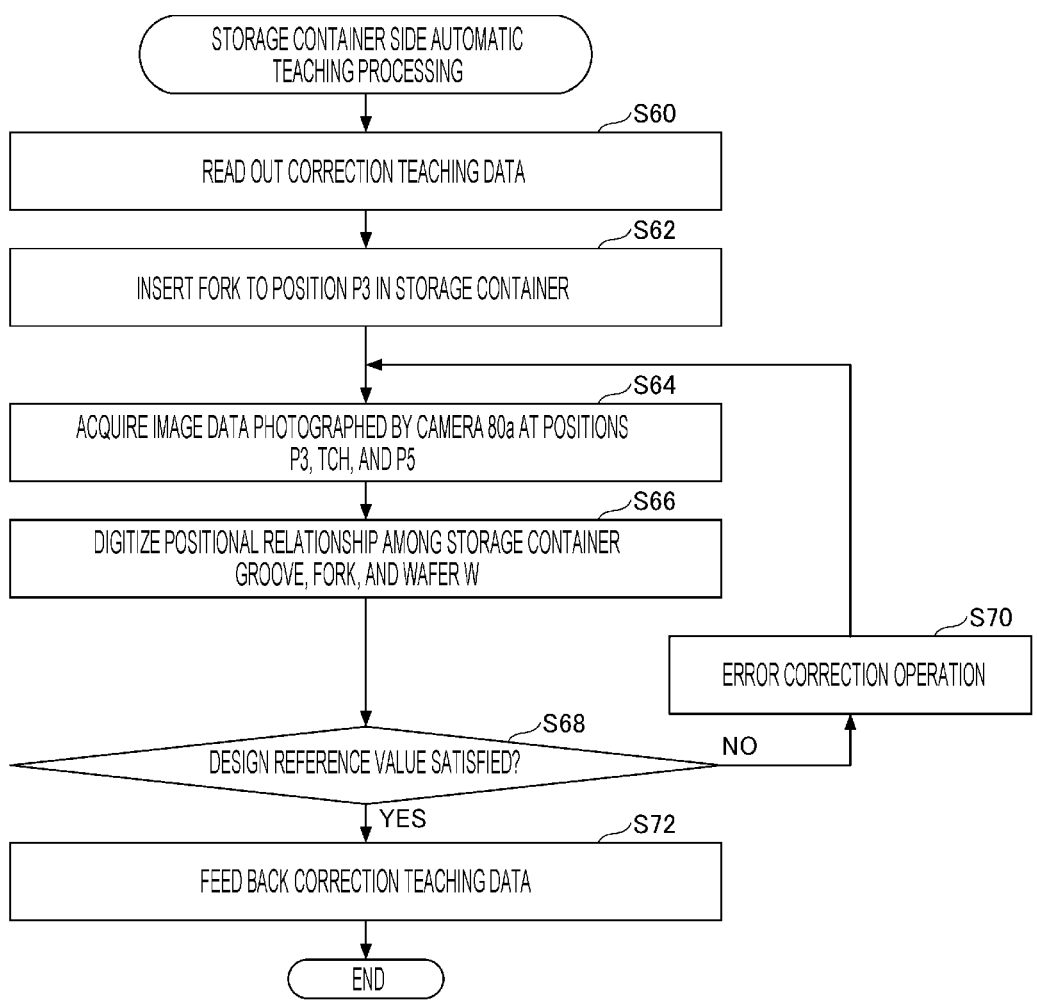
FIG. 10 is a flowchart of an example of a storage container side automatic teaching processing according to the present embodiment.

FIG. 10 is a flowchart illustrating an example of a storage container side automatic teaching processing according to the present embodiment. In step S60, the autonomous control unit 130 of the control device 100 reads out the correction teaching data from the database 160. The correction teaching data read out in step S60 is the correction teaching data stored in the database 160 according to the flowchart illustrated in FIG. 9.

In step S62, the autonomous control unit 130 controls the transport device control unit 150 to insert the fork 59 to the position P3 in the storage container 21 based on the correction teaching data. The transport device control unit 150 controls a moving operation of the transfer mechanism 47 to insert the fork 59 to the position P3 in the storage container 21, for example, as illustrated in FIG. 11, according to the correction teaching data.

Figure 11:
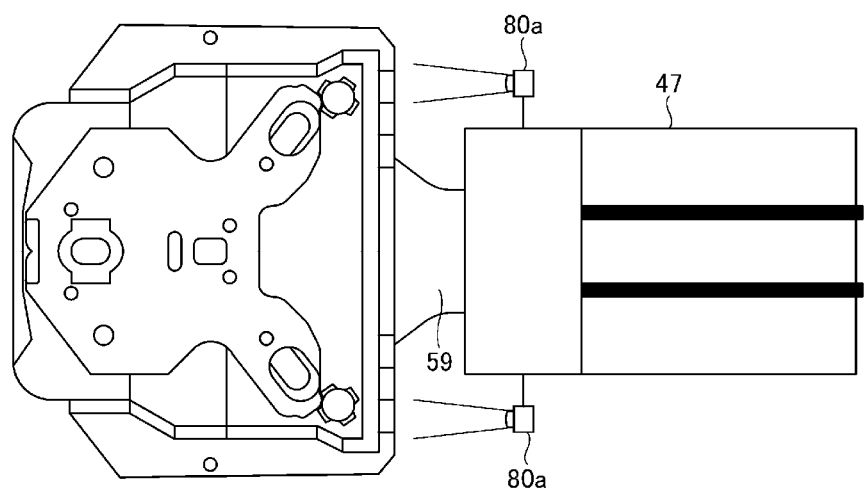
FIG. 11 is an image diagram of an example of a storage container with a fork inserted therein.

FIG. 11 is an image diagram of an example of a storage container with a fork inserted therein. The camera 80a in FIG. 11 may photograph the direction from the transfer mechanism 47 to the storage container 21 or 22. In step S64, the autonomous control unit 130 controls the camera 80a to perform photographing at the positions P3, TCH, and P5 in the storage container 21. The image data acquisition unit 110 acquires image data photographed by the camera 80a at the positions P3, TCH, and P5 in the storage container 21. In step S66, the image processing unit 120 digitizes a positional relationship among the storage container groove, the fork 59, and the wafer W by image-processing the image data photographed at the positions P3, TCH, and P5 in the storage container 21.

For example, the image processing unit 120 measures the distance between the lower surface of the wafer W held by the storage container 21 and the wafer mounting surface of the fork 59 and the distance between the edge of the storage container groove and the edge of the fork 59 by image-processing the image data photographed at the position P3. The image processing unit 120 measures the distance between the lower surface of the wafer W held by the storage container 21 and the wafer mounting surface of the fork 59 and the distance between the edge of the storage container groove and the edge of the fork 59 by image processing the image data photographed at the position TCH. Further, the image processing unit 120 measures the distance between the lower surface of the wafer W held by the fork 59 and the upper surface of the storage container groove and the distance between the edge of the storage container groove and the edge of the wafer W held by the fork 59 by image-processing the image data photographed at the position P5.

In step S68, the autonomous control unit 130 determines whether or not the measured distance satisfies a design reference value. When the design reference value is not satisfied, the autonomous control unit 130 performs an error correction operation in step S70, and repeatedly performs position correction of the moving operation of the fork 59 until the design reference value is satisfied.

In step S72, the autonomous control unit 130 feeds back the correction teaching data by storing the correction teaching data in the database 160 according to the result of the position correction of the moving operation of the fork 59 satisfying the design reference value.

Figure 12:
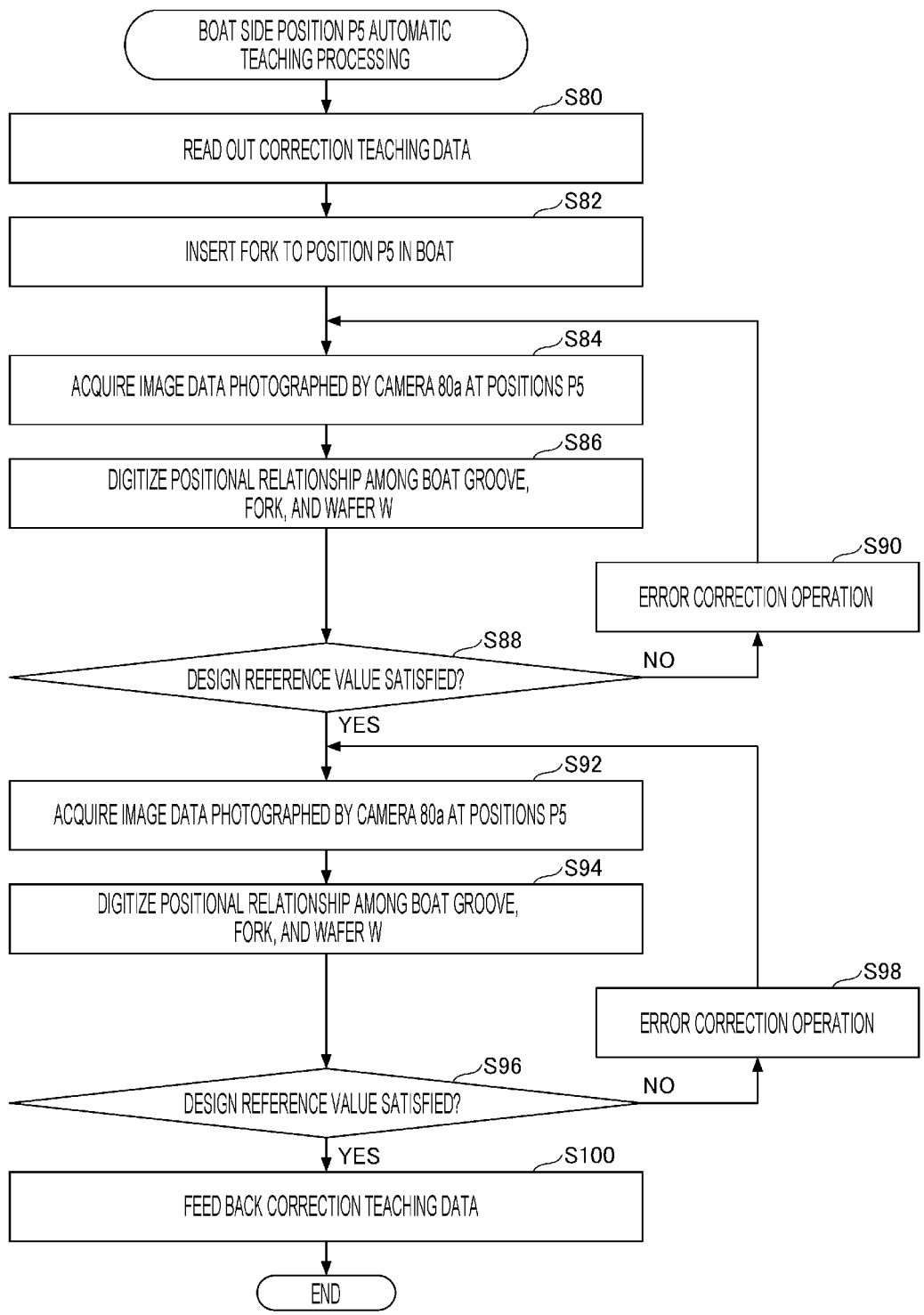
FIG. 12 is a flowchart of an example of a boat side automatic teaching processing according to the present embodiment.

FIG. 12 is a flowchart of an example of a boat side automatic teaching processing according to the present embodiment. In step S80, the autonomous control unit 130 of the control device 100 reads out the correction teaching data from the database 160. The correction teaching data read out in step S80 is the correction teaching data stored in the database 160 according to the flowchart illustrated in FIG. 7.

In step S82, the autonomous control unit 130 controls the transport device control unit 150 to insert the fork 59 to the position P5 in the boat 44a based on the correction teaching data. The transport device control unit 150 controls a moving operation of the transfer mechanism 47 to insert the fork 59 to the position P5 in the boat 44a, for example, as illustrated in FIG. 13, according to the correction teaching data.

Figure 13:
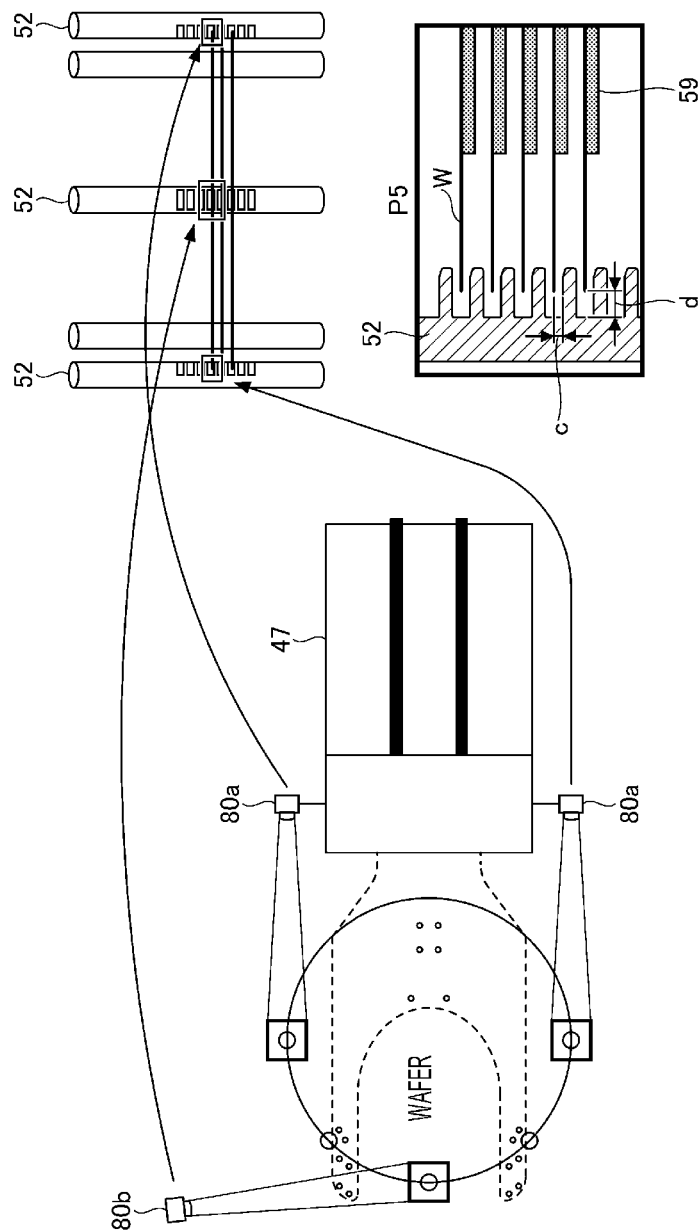
FIG. 13 is an image diagram of an example of a boat with a fork inserted therein.

FIG. 13 is an image diagram of an example of a boat with a fork inserted therein. As illustrated in FIG. 13, the cameras 80a and 80b are provided to be able to photograph the boat groove at three points of the boat 44a.

In step S84, the autonomous control unit 130 controls the camera 80a to perform photographing at the position P5 in the boat 44a. The image data acquisition unit 110 acquires image data photographed by the camera 80a at the position P5 in the boat 44a.

In step S86, the image processing unit 120 performs an image processing on the image data photographed by the camera 80a at the position P5 in the boat 44a to digitize a positional relationship among the boat groove, the fork 59, and the wafer W.

For example, the image processing unit 120 measures the distance c between the lower surface of the wafer W held by the fork 59 and the upper surface of the boat groove and the distance d between the support column 52 and the edge of the wafer W by image-processing the image data photographed by the camera 80a at the position P5.

In step S88, the autonomous control unit 130 determines whether or not the measured distances satisfy a design reference value. When the design reference value is not satisfied, the autonomous control unit 130 performs an error correction operation in step S90, and repeatedly performs position correction of the moving operation of the fork 59 until the design reference value is satisfied.

When the design reference value is satisfied, the autonomous control unit 130 proceeds to a processing of step S92. The autonomous control unit 130 controls the camera 80b to perform photographing at the position P5 in the boat 44a. The image data acquisition unit 110 acquires image data photographed by the camera 80b at the position P5 in the boat 44a.

In step S94, the image processing unit 120 performs an image processing on the image data photographed by the camera 80b at the position P5 of the boat 44a to digitize a positional relationship among the boat groove, the fork 59, and the wafer W.

For example, the image processing unit 120 measures the distance c between the lower surface of the wafer W held by the fork 59 and the upper surface of the boat groove and the distance d between the support column 52 and the edge of the wafer W by image-processing the image data photographed by the camera 80b at the position P5.

In step S96, the autonomous control unit 130 determines whether or not the measured distance satisfies a design reference value. When the design reference value is not satisfied, the autonomous control unit 130 performs an error correction operation in step S98, and repeatedly performs position correction of the moving operation of the fork 59 until the design reference value is satisfied.

In step S100, the autonomous control unit 130 feeds back the correction teaching data by storing the correction teaching data in the database 160 according to the result of the position correction of the moving operation of the fork 59 satisfying the design reference value.

Figure 14:
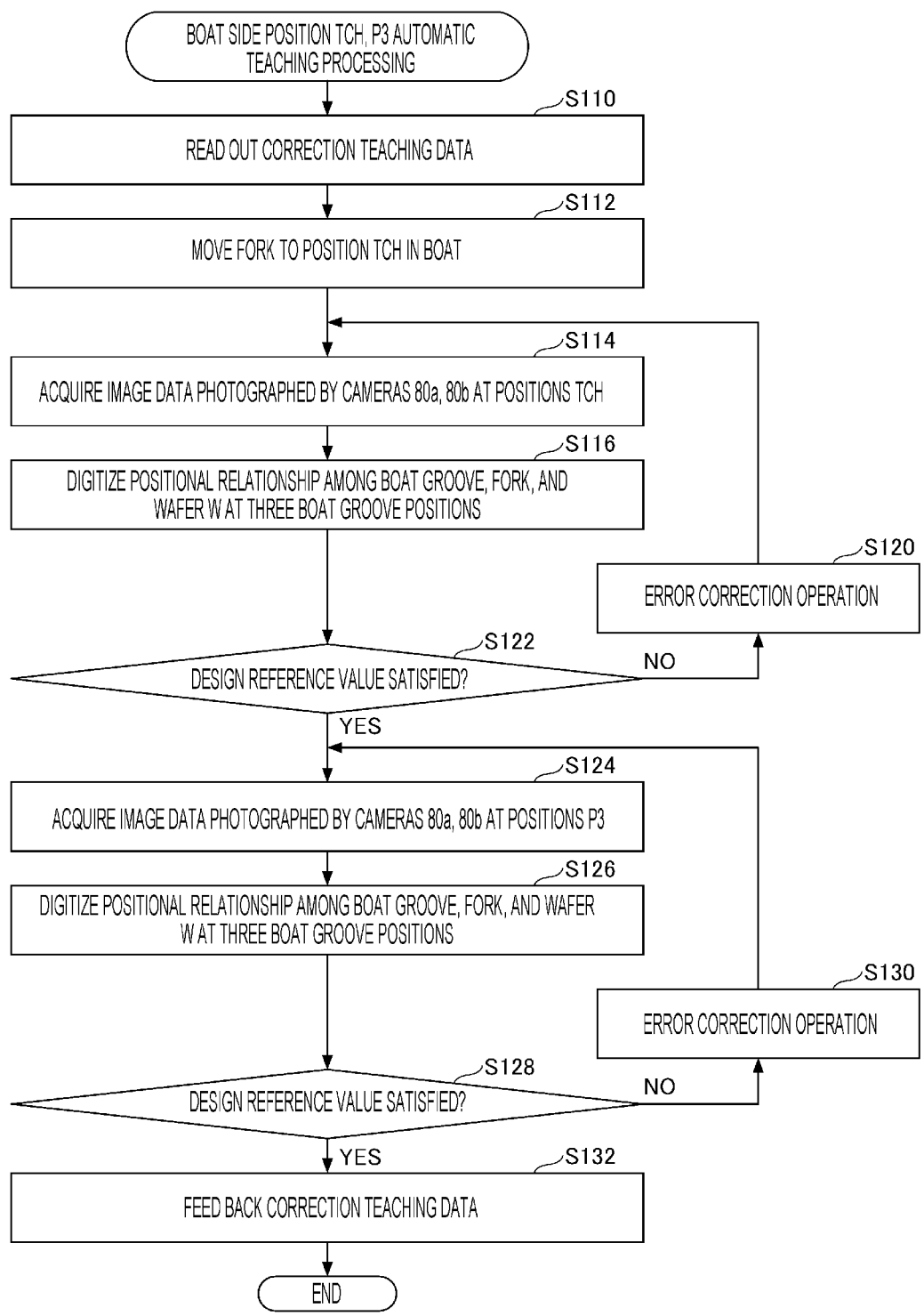
FIG. 14 is a flowchart of an example of a boat side automatic teaching processing according to the present embodiment.

FIG. 14 is a flowchart of an example of a boat side automatic teaching processing according to the present embodiment. In step S110, the autonomous control unit 130 of the control device 100 reads out the correction teaching data from the database 160. The correction teaching data read out in step S110 is the correction teaching data stored in the database 160 according to the flowchart illustrated in FIG. 12.

In step S112, the autonomous control unit 130 controls the transport device control unit 150 to move the fork 59 to the position TCH in the boat 44a based on the correction teaching data. The transport device control unit 150 controls a moving operation of the transfer mechanism 47 to move the fork 59 to the position TCH in the boat 44a, for example, as illustrated in FIG. 15, according to the correction teaching data.

Figure 15:
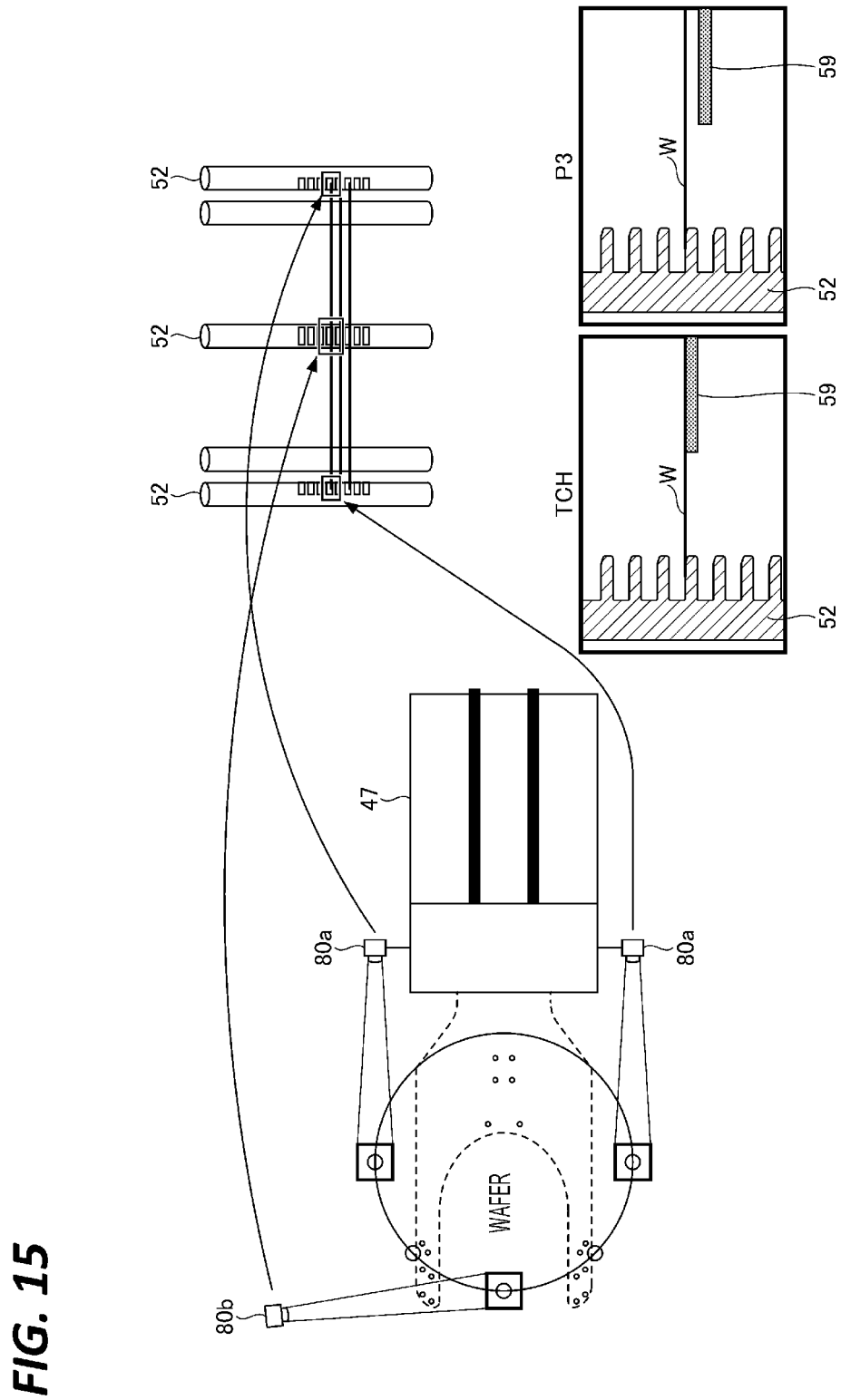
FIG. 15 is an image diagram of an example of a boat with a fork inserted therein.

FIG. 15 is an image diagram of an example of a boat with a fork inserted therein. As illustrated in FIG. 15, the cameras 80a and 80b are provided to be able to photograph the boat groove at three points of the boat 44a in a state where the transfer mechanism 47 has been moved to the positions TCH and P3.

In step S114, the autonomous control unit 130 controls the cameras 80a and 80b to perform photographing at the position TCH in the boat 44a. The image data acquisition unit 110 acquires image data photographed by the cameras 80a and 80b at the position TCH in the boat 44a.

In step S116, the image processing unit 120 performs an image processing on the image data photographed by the cameras 80a and 80b at the position TCH in the boat 44a to digitize a positional relationship among the boat groove, the fork 59, and the wafer W at the boat groove at three points.

For example, the image processing unit 120 measures the distance between the lower surface of the wafer W held by the fork 59 and the upper surface of the boat groove and the distance between the support column 52 and the edge of the wafer W by image-processing the image data photographed by the cameras 80a and 80b at the position TCH.

In step S118, the autonomous control unit 130 determines whether or not the measured distance satisfies a design reference value. When the design reference value is not satisfied, the autonomous control unit 130 performs an error correction operation in step S120, and repeatedly performs position correction of the moving operation of the fork 59 until the design reference value is satisfied.

When the design reference value is satisfied, the autonomous control unit 130 proceeds to a processing of step S124. The autonomous control unit 130 controls the cameras 80a and 80b to perform photographing at the position P3 in the boat 44a. The image data acquisition unit 110 acquires image data photographed by the cameras 80a and 80b at the position P3 in the boat 44a.

In step S126, the image processing unit 120 performs an image processing on the image data photographed by the cameras 80a and 80b at the position P3 in the boat 44a to digitize a positional relationship among the boat groove, the fork 59, and the wafer W at the boat groove at three points.

For example, the image processing unit 120 measures the distance between the lower surface of the wafer W held by the boat groove and the wafer mounting surface of the fork 59 and the distance between the support column 52 and the edge of the wafer W by image-processing the image data photographed by the cameras 80a and 80b at the position P3.

In step S128, the autonomous control unit 130 determines whether or not the measured distance satisfies a design reference value. When the design reference value is not satisfied, the autonomous control unit 130 performs an error correction operation in step S130, and repeatedly performs position correction of the moving operation of the fork 59 until the design reference value is satisfied.

In step S132, the autonomous control unit 130 feeds back the correction teaching data by storing the correction teaching data in the database 160 according to the result of the position correction of the moving operation of the fork 59 satisfying the design reference value.

The processing of the flowcharts illustrated in FIGS. 12 and 14 may be performed for each area by dividing the boat 44a into two upper and lower areas or three or more areas according to the height thereof, which may further improve the accuracy thereof.

According to the present embodiment, for example, the adjustment work time at the time of start-up (installation of a device) or after the replacement of a quartz jig may be shortened as compared with the adjustment work by the operator, and the transfer margin by high-precision adjustment may be increased. Further, according to the present embodiment, it may be expected that the Mean Time Between Failures (MTTF) will be extended by increasing the transfer margin, which may improve the added value of the heat treatment apparatus 10.

Further, in the present embodiment, the positional relationship among the position of the support portion such as the groove or the claw of the storage container 21 or 22, the position of the support portion such as the groove or the claw of the boat 44a or 44b, the position of the fork 59 of the transfer mechanism 47, and the position of the wafer W is digitized by the image processing, but, an optical sensor may be used in combination. Further, in the present embodiment, centering of the wafer W on the boat 44a or 44b may be realized, and the inclination of the boat 44a or 44b on the basis of the transfer mechanism 47 may be analyzed by calculation. Furthermore, in the present embodiment, the positional shift of the wafer W held by the fork 59 may be analyzed from the image data photographed by the camera 80b, and the deviation of the positional shift may be corrected, so that the transfer of the wafer W may be continued.

In the above embodiment, a so-called ladder boat in which a plurality of support columns are provided between a top plate and a bottom plate which are arranged to vertically oppose each other, a plurality of grooves are formed in the inner side surface of each support column, and the peripheral edge portion of the wafer W is inserted into and supported by the grooves has been described as an example, but the present disclosure is not limited to the shape of the ladder boat.

For example, the present disclosure may also be applied to a so-called ring boat in which a plurality of support columns are provided between a top plate and a bottom plate which are arranged to vertically oppose each other, a ring member having a flat support surface is provided on the plurality of columns, and the wafer W is supported on the support surface of the ring member. Further, the present disclosure may also be applied to other specially shaped boats.

According to the present disclosure, it is possible to automate the teaching of a moving operation with respect to a transport device that transports a processing target substrate.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:
1. An information processing apparatus of a substrate processing apparatus including a transport device equipped with a plurality of forks and a photographing device equipped with a camera, the information processing apparatus comprising:
a memory;
a processor coupled to the memory and configured to:
acquire, from the photographing device provided to photograph a disposing position of a substrate by one or more of the plurality of forks of the transport device in a transport source object and a transport destination object, image data of the disposing position of the substrate in the transport source object and the transport destination object, each of the transport source object and the transport destination object including a boat or a storage container in which the substrate transported by the transport device is disposed;
measure a positional relationship among the transport source object, the transport device, and the substrate based on the image data obtained by photographing a moving operation of the transport device that receives the substrate from the disposing position of the substrate in the transport source object;
measure a positional relationship among the transport destination object, the transport device, and the substrate based on the image data obtained by photographing a moving operation of the transport device that disposes the substrate at the disposing position of the substrate in the transport destination object;
output first correction data of the moving operation of the transport device that receives the substrate from the transport source object based on the measured positional relationship among the disposing position of the substrate in the transport source object, the transport device, and the substrate;
output second correction data of the moving operation of the transport device of disposing the substrate in the transport destination object based on the measured positional relationship among the disposing position of the substrate in the transport destination object, the transport device, and the substrate; and
teach a transfer position of the substrate in each of the transport source object and the transport destination object to the transport device based on the first and second correction data while the substrate is transported between the transport source object and the transport destination object by the one or more of the plurality of forks of the transport device.

2. The information processing apparatus according to claim 1, wherein the processor is further configured to acquire image data capable of measuring, by an image processing, a positional relationship among the substrate, a support that supports the substrate in the transport source object and the transport destination object, and a transfer plate that supports the substrate in the transport device.

3. The information processing apparatus according to claim 2, wherein the processor is further configured to:
acquire image data capable of measuring, by an image processing, a positional relationship among the substrate, at least three supports that support the substrate in the transport source object or the transport destination object in which the substrate is disposed, and the transfer plate that supports the substrate in the transport device; and
measure, for each of the three supports, the positional relationship among the substrate, the three supports of the transport source object or the transport destination object in which the substrate is disposed, and the transfer plate that supports the substrate in the transport device.

4. The information processing apparatus according to claim 1, wherein the processor is further configured to:
  measure, based on first image data photographed when the transport device is moved to a first position before receiving the substrate, second image data photographed when the transport device is moved to a second position where the transport device receives the substrate, and third image data photographed when the transport device is moved to a third position after receiving the substrate, during the moving operation of the transport device that receives the substrate from the disposing position of the substrate in the transport source object, a positional relationship among the transport source object, the transport device, and the substrate at the first position, the second position, and the third position, and
  output the first correction data of the disposing position of the substrate in the transport source object based on the measured positional relationship among the disposing position of the substrate in the transport source object, the transport device, and the substrate at the first position, the second position, and the third position.

5. The information processing apparatus according to claim 1, wherein the processor is further configured to:
  measure, based on fourth image data photographed when the transport device is moved to a fourth position before disposing substrate, fifth image data photographed when the transport device is moved to a fifth position where the transport device disposes the substrate, and sixth image data photographed when the transport device is moved to a sixth position after disposing the substrate, during the moving operation of the transport device that disposes the substrate at the disposing position in the transport destination object, a positional relationship among the transport destination object, the transport device, and the substrate at the fourth position, the fifth position, and the sixth position, and
  output third correction data of the disposing position of the substrate in the transport destination object based on the measured positional relationship among the disposing position in the transport destination object, the transport device, and the substrate at the fourth position, the fifth position, and the sixth position.

6. The information processing apparatus according to claim 1, wherein the processor is further configured to:
  measure a positional relationship among the disposing position of the substrate in the transport source object and the transport destination object, the transport device, and the substrate, based on the image data obtained by photographing the moving operation of the transport device based on initial teaching data of the substrate processing apparatus; and
  output the first correction data or the second correction data of the moving operation of the transport device that receives the substrate based on the digitized measured positional relationship among the disposing position of the substrate in the transport source object and the transport destination object, the transport device, and the substrate, and based on a design reference value of the positional relationship.

7. The information processing apparatus according to claim 1, wherein the photographing device includes a plurality of cameras capable of photographing an error in vertical and horizontal directions of the disposing position of the substrate in the transport source object and the transport destination object and at least one camera capable of photographing an error in a longitudinal direction of the disposing position of the substrate in the transport source object and the transport destination object, among the vertical and horizontal directions and the longitudinal direction in which the moving operation of the transport device is available.

8. The information processing apparatus according to claim 1, wherein the storage container includes a front opening unified pod (FOUP).

9. A transfer position teaching method of an information processing apparatus of a substrate processing apparatus including a transport device equipped with a plurality of forks and a photographing device equipped with a camera, the method comprising:
  acquiring, a processor, from the photographing device provided to photograph a disposing position of a substrate by one or more of the plurality of forks of the transport device in a transport source object and a transport destination object, image data of the disposing position of the substrate in the transport source object and the transport destination object, each of the transport source object and the transport destination object including a boat or a storage container that supports the substrate transported by the transport device;
  measuring, by the processor, a positional relationship among the transport source object, the transport device, and the substrate based on the image data obtained by photographing a moving operation of the transport device that receives the substrate from the disposing position of the substrate in the transport source object;
  measuring, by the processor, a positional relationship among the transport destination object, the transport device, and the substrate based on the image data obtained by photographing a moving operation of the transport device that disposes the substrate at the disposing position of the substrate in the transport destination object;
  outputting, by the processor, first correction data of the moving operation of the transport device that receives the substrate from the transport source object based on the measured positional relationship among the disposing position of the substrate in the transport source object, the transport device, and the substrate;
  outputting, by the processor, second correction data of the moving operation of the transport device that disposes the substrate in the transport destination object based on the measured positional relationship among the disposing position of the substrate in the transport destination object, the transport device, and the substrate; and
  teaching a transfer position of the substrate in each of the transport source object and the transport destination object to the transport device based on the first and second correction data while the substrate is transported between the transport source object and the transport destination object by the one or more of the plurality of forks of the transport device.

10. A substrate processing apparatus comprising:
  a transport unit including a fork configured to transport a substrate between a transport source object and a transport destination object each accommodating the substrate therein, each of the transport source object and the transport destination object including a boat or a storage container that supports the substrate transported by the transport device;
  a photographing unit including a camera provided to photograph a disposing position of the substrate by one or more of a plurality of forks of the transport unit in the transport source object and the transport destination object; and a controller configured to control an overall operation of the transport unit and the photographing unit, wherein the controller is configured to:

acquire, from the photographing unit, image data of the disposing position of the substrate in the transport source object and the transport destination object;

measure a first positional relationship among the transport source object, the transport unit, and the substrate based on the image data obtained by photographing a moving operation of the transport unit that receives the substrate from the disposing position of the substrate in the transport source object;

measure a second positional relationship among the transport destination object, the transport unit, and the substrate based on the image data obtained by photographing a moving operation of the transport unit that disposes the substrate at the disposing position of the substrate in the transport destination object;

output first correction data of the moving operation of the transport unit that receives the substrate from the transport source object based on the measured positional relationship among the disposing position of the substrate in the transport source object, the transport unit, and the substrate;

output second correction data of the moving operation of the transport unit that disposes the substrate in the transport destination object based on the measured positional relationship among the disposing position of the substrate in the transport destination object, the transport unit, and the substrate; and teach a transfer position of the substrate in each of the transport source object and the transport destination object to the transport unit based on the first and second correction data while the substrate is transferred between the transport source object and the transport destination object by the one or more of the plurality of forks of the transport unit.

* * * * *